(12) United States Patent
Hudak et al.

(10) Patent No.: US 6,391,744 B1
(45) Date of Patent: May 21, 2002

(54) METHOD OF FABRICATING A NON-SOI DEVICE ON AN SOI STARTING WAFER AND THINNING THE SAME

(75) Inventors: John J. Hudak, Columbia; Thomas R. Neal, Catonsville; Pramod Chintaman Karulkar, Ellicott City, all of MD (US)

(73) Assignee: The United States of America as represented by the National Security Agency, Washington, DC (US)

(*) Notice: Subject to any disclaimer, the term of this patent is extended or adjusted under 35 U.S.C. 154(b) by 0 days.

(21) Appl. No.: 08/820,200

(22) Filed: Mar. 19, 1997

(51) Int. Cl.[7] .......................... H01L 21/46; H01L 21/30
(52) U.S. Cl. ........................................ 438/459; 438/149
(58) Field of Search .................................. 438/142, 149, 438/459, 155, 311; 257/75, 213, 347, 345

(56) References Cited

U.S. PATENT DOCUMENTS

| | | | |
|---|---|---|---|
| 3,647,581 A | * 3/1972 | Mash | |
| 5,013,681 A | 5/1991 | Godbey et al. | |
| 5,034,343 A | 7/1991 | Rouse et al. | |
| 5,213,986 A | 5/1993 | Pinker et al. | |
| 5,227,339 A | * 7/1993 | Kishii | |
| 5,234,535 A | 8/1993 | Beyer et al. | |
| 5,279,703 A | * 1/1994 | Haberger et al. | |
| 5,344,524 A | * 9/1994 | Sharma et al. | |
| 5,659,192 A | * 8/1997 | Sarma et al. | |
| 5,674,758 A | * 10/1997 | McCarthy | |

OTHER PUBLICATIONS

Stanley Wolf, Silicon Processing for the VLSI Era, vol. 2, pp. 66–78, 1990.*
S. M. Sze, VLSI Technology, second edition, pp. 41–44, 1988.*
G. W. Cullen, "Single–Crystal Silicon on Non–Single Crystal Insulators", Journal of Crystal Growth, vol. 63, No. 3, pp. i–vi, Oct. 1983.*

* cited by examiner

Primary Examiner—Charles Bowers
Assistant Examiner—Evan Pert
(74) Attorney, Agent, or Firm—Robert D. Morelli

(57) ABSTRACT

A method of thinning a non-SOI device using an SOI thinning process that includes the steps of receiving an SOI starting wafer, where the SOI starting wafer includes a silicon substrate and an oxide layer thereon; selecting a non-SOI fabrication process for fabricating the non-SOI device; forming a layer of device quality silicon on the oxide layer of the SOI starting wafer to a sufficient thickness and doping profile to realize the non-SOI device; fabricating the non-SOI device in the device quality silicon layer using the non-SOI fabrication process selected; forming a support layer on the device quality silicon layer having the non-SOI device fabricated therein; and thinning the result of the last step using the SOI thinning process.

15 Claims, 4 Drawing Sheets

METHOD OF FABRICATING A NON-SOI DEVICE ON AN SOI STARTING WAFER AND THINNING THE SAME

FIELD OF THE INVENTION

The present invention relates, in general, to a semiconductor device manufacturing process, and, in particular, to a method of fabricating a non-silicon-on-insulator (non-SOI) device on a silicon-on-insulator (SOI) starting wafer and thinning the same.

BACKGROUND OF THE INVENTION

The prior art methods of thinning a semiconductor wafer include a variety of mechanical and chemical means for removing silicon from wafers or dice. Mechanical means for removing silicon include grinding, lapping, polishing, and sputtering. Chemical means for removing silicon include wet chemical etching, dry reactive ion etching, electro-chemical methods, and photon assisted electro-chemical methods. In practice, these methods are used in combination. For example, grinding may be performed before lapping. Also, chemical and mechanical polishing, which is the most effective thinning method, may be performed after grinding.

Mechanical grinding is the fastest way to remove material from a semiconductor wafer. It can provide a high degree of uniformity of thickness across a wafer but may also cause damage to the silicon being thinned. Any defect in the crystal structure of a wafer may cause a device fabricated therein to fail.

A chemical etch process may cause poor uniformity of thickness across a wafer. Improved uniformity of thickness may be achieved by including a so-called "etch stop" within the device to be thinned by chemical etching. An etch stop is a layer of material which has an etch rate that is much lower than the silicon to be etched. The etch stop serves as an end point to the etch process and is usually made to have a high degree of flatness which in turn results in excellent uniformity of thickness.

The typical etch stop for an SOI wafer (i.e., a buried oxide layer) has some advantages over the typical etch stop for a non-SOI wafer (i.e., a dopant concentration gradient). The buried oxide layer provides an abrupt etch stop and allows for any type of doped silicon layer (i.e., N-type or P-type) to be formed on the oxide layer. An etch stop composed of a buried dopant concentration gradient has a measurable transition length which may increase in size during a subsequent high temperature processing step. Doping has an effect on etch rate. Failure to fabricate an abrupt change in doping concentration provides an ill-defined etch stop which may result in poor uniformity of thickness and unwanted residual dopants. Therefore, an SOI thinning process is superior to a non-SOI thinning process.

A non-SOI fabrication process (e.g., CMOS, NMOS, PMOS, Bipolar, BICMOS, etc.) has some advantages over an SOI fabrication process. For example, a non-SOI wafer is less expensive that an SOI wafer. A non-SOI wafer has, on average, a lower defect density. Non-SOI fabrication lines are more numerous than SOI fabrication lines. Many different circuit technologies (e.g., CMOS, NMOS, PMOS, Bipolar, BICMOS, etc.) may be fabricated in a non-SOI fabrication line than may be fabricated in an SOI fabrication line. The present invention is a method of combining non-SOI fabrication technologies with an SOI thinning process.

U.S. Pat. No. 5,013,681, entitled "METHOD OF PRODUCING A THIN SILICON-ON-INSULATOR LAYER," discloses a standard SOI thinning process with a novel etch-stop material (i.e., a metal). U.S. Pat. No. 5,013,681 is hereby incorporated by reference into the specification of the present invention.

U.S. Pat. No. 5,034,343, entitled "MANUFACTURING ULTRA-THIN WAFER USING A HANDLE WAFER," discloses a method of thinning a wafer, fabricating devices in the thinned wafer, bonding an SOI wafer to the thinned and fabricated wafer, and then thinning this combination. U.S. Pat. No. 5,034,343 is hereby incorporated by reference into the specification of the present invention.

U.S. Pat. No. 5,213,986, entitled "PROCESS FOR MAKING THIN FILM SILICON-ON-INSULATOR WAFERS EMPLOYING WAFER BONDING AND WAFER THINNING," discloses a method of implanting ions into a first wafer, growing an oxide on a second wafer, bonding the two wafers together, and thinning the portion containing the ions. U.S. Pat. No. 5,213,986 is hereby incorporated by reference into the specification of the present invention.

U.S. Pat. No. 5,234,535, entitled "METHOD OF PRODUCING A THIN SILICON-ON-INSULATOR LAYER," discloses a method of fabricating a first wafer that includes devices, bonding the first wafer to a second wafer having an oxide layer, and thinning the first wafer. U.S. Pat. No. 5,234,535 is hereby incorporated by reference into the specification of the present invention.

SUMMARY OF THE INVENTION

It is an object of the present invention to fabricate a non-SOI device and thin the same using an SO thinning process.

It is another object of the present invention to form a device quality silicon layer on an SOI starting wafer, fabricate a non-SOI device in the SOI wafer, and thin the same using an SOI thinning process.

It is another object of the present invention to provide mechanical support to the thinned device so that the thinned device may be handled and manipulated without being damaged.

The present invention is a method of forming a non-SOI device in an SOI starting wafer and thinning the same using an SOI thinning process. Non-SOI devices include circuity formed in various semiconductor technologies such as NMOS, PMOS, CMOS, Bipolar, BICMOS, and so on. Other devices that may be formed include sensors, mechanical devices, and electromechanical devices. The present invention results in a method that combines the advantages of a non-SOI fabrication process with the superior uniformity of thickness obtained with an SOI wafer thinning process.

The first step in the method is to form a suitable layer of device quality silicon on an SOI starting wafer. The SOI starting wafer consists of a thick, approximately 675 micron (um) thick, silicon substrate covered on one side by a thin, approximately 0.2 um thick, layer of oxide. The device quality silicon layer formed on the SOI starting wafer is approximately 0.2 um thick. To be suitable for the fabrication of non-SOI devices, the device quality silicon layer must be sufficiently thick and appropriately doped to form therein a non-SOI device. This may be accomplished by the epitaxial growth of doped silicon on the device quality silicon layer. Alternatively, instead of forming a silicon layer on the SOI starting wafer, a pre-formed silicon layer may be bonded to an oxide coated silicon wafer to form a "bonded" SOI starting wafer.

The second step in the method is to fabricate a non-SOI device in the device quality silicon layer using a non-SOI fabrication process selected by the user.

The third step in the method is to coat the non-SOI device with a layer of polyimide. The polyimide, which is, preferably, 8 um thick, provides mechanical support for the non-SOI device. Any other suitable material may be applied to provide such support. Instead of applying a polyimide layer at this step, it may be applied to the oxide layer of the SOI starting wafer after the silicon substrate of the SOI starting wafer is removed.

The fourth step in the method is to use an SOI thinning process to thin the fabricated wafer. That is, use an SOI thinning process to remove the silicon substrate of the SOI starting wafer so that the user is left with a structure having an oxide layer, a device quality silicon layer on the oxide layer, a device formed in the device quality silicon layer, and a polyimide layer on the device.

The SOI thinning process used by the present method may be as follows. The device resulting from the second step above is bonded device-side down onto a handle wafer. Any suitable bonding material will do, but wax is preferred. Next, the silicon of the SOI starting wafer is coarse ground mechanically. Typically, SOI starting wafers are approximately 675 um thick. Coarse grinding may be used to thin the SOI starting wafer to a thickness within the range of 150 um to 25 um. Next, the SOI starting wafer is chemically etched until the oxide layer of the SOI starting wafer is reached. The oxide layer is commonly referred to as an "etch stop." The last step in the SOI thinning process is to release the thinned device from the handle wafer. If wax is used as the bonding agent, the wax is melted and the thinned device is slid off of the handle wafer.

The present invention combines the best of non-SOI fabrication processes with the superior thinning characteristics of an SOI thinning process. The present method may be used to thin non-SOI devices to below 10 um with uniformity of thickness of better than 5% across a 150 mm device.

DETAILED DESCRIPTION

The present invention is a method of thinning a non-SOI device using an SOI thinning process. The present invention results in a method that combines the advantages of a non-SOI fabrication process with the superior performance of an SOI thinning process.

Figure 1:
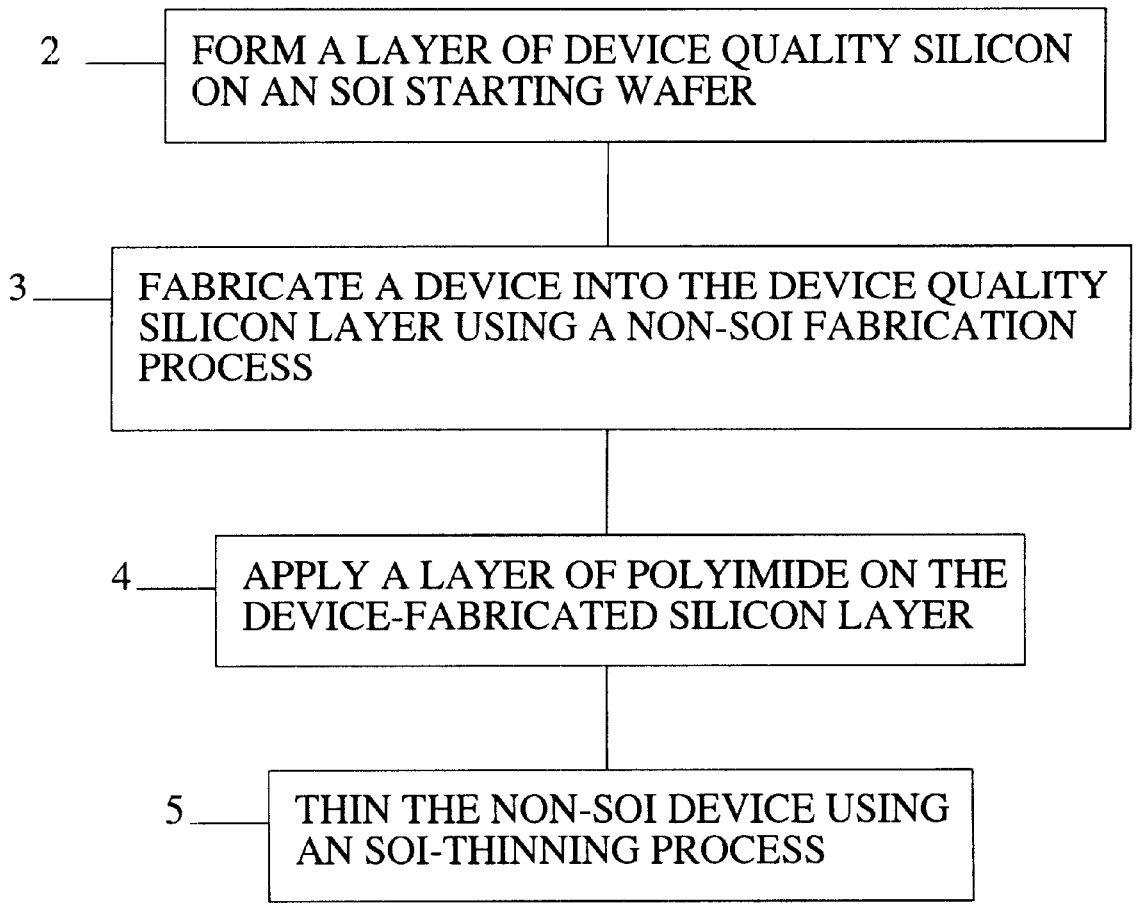
FIG. 1 lists the steps of the present invention.
Figure 2:
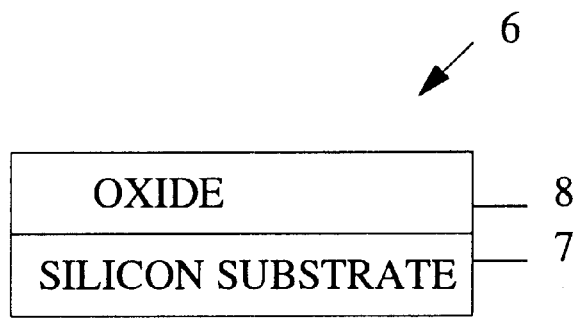
FIG. 2 is a side cross-sectional view of an SOI starting wafer.

FIG. 1 lists the steps of the present invention 1. The first step 2 is to form a suitable layer of device quality silicon on an SOI starting wafer. There are many ways to make an SOI starting wafer (e.g., zone melt refining, SIMOX, or bonded SOI). The present invention is not limited by the method used to make the SOI starting wafer. An SOI starting wafer is typically 675 um thick. FIG. 2 shows a side cross-sectional view of an SOI starting wafer 6. The SOI starting wafer 6 consists of a silicon substrate 7 and an oxide layer 8 thereon. The oxide layer 8, which is commonly referred to as a buried oxide layer, must be free of pin holes and must be sufficiently thick to act as an etch stop in a subsequent thinning process. A buried oxide layer thickness in the range of from 0.2 um to 0.4 um is sufficient to act as an etch stop.

Figure 3:
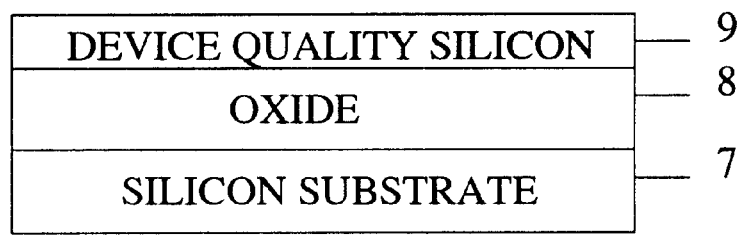
FIG. 3 is a side cross-sectional view of an SOI starting wafer including a layer of device quality silicon.

FIG. 3 shows a side cross-sectional view of the SOI staring wafer 6 of FIG. 2 with a layer of device quality silicon 9 formed on the oxide layer 8. The device quality silicon layer 9 must provide all of the electrically active silicon required by the non-SOI device subsequently fabricated therein. Consequently, the doping profile of the device quality silicon layer 9 must be the same as that which would be used if the desired non-SOI device were fabricated in a non-SOI, or bulk, silicon wafer. The device quality silicon layer 9 must be thick enough to provide all of the underlying current paths required by the non-SOI device. The minimum thickness of the device quality silicon layer 9 may be determined by simulation or empirical data. An epitaxial (or epi) layer may be used as the device quality silicon layer 9. Epi layers as thick as 50 um may be used, but defect density is linearly proportional to epi thickness. That is, the thicker the epi, the higher the defect density. Alternatively, a preformed device quality silicon layer may be bonded to the SOI starting wafer 6.

The oxide layer 8 may be 0.2 um to 0.4 um thick. The SOI starting wafer 6 is commercially available. The silicon substrate 7 of the SOI starting wafer 6 provides mechanical support for the non-SOI device fabricated in the device quality silicon layer 9. The device quality silicon layer 9 renders the silicon substrate of the SOI starting wafer 6 electrically useless. Therefore, removal of the silicon substrate 7 would decrease the thickness of the resulting non-SOI device by at least 92.5% (i.e., 50 um/675 um, where the thickness of the SOI starting wafer 6 with the device quality silicon layer 9 is 675 um thick and the thinned non-SOI structure may be 50 um thick). Note that the present invention may result in a thinned non-SOI device that is less than 10 um thick.

Figure 4:
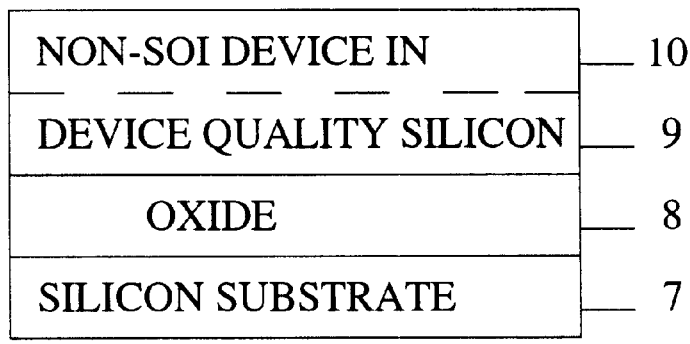
FIG. 4 is a side cross-sectional view of the device of FIG. 3 with a non-SOI device fabricated in the layer of device quality silicon.

The second step 3 in the method listed in FIG. 1 is to fabricate a non-SOI device as desired by the user into the device quality silicon layer 9. FIG. 4 shows a cross-sectional view of the structure of FIG. 3 with the addition of a non-SOI device 10 fabricated into the device quality silicon layer 9. Examples of non-SOI fabrication processes include CMOS, NMOS, PMOS, Bipolar, BICMOS, and so on. The types of non-SOI devices that may be fabricated include electronic circuitry using the technologies listed above, sensors, mechanical devices, and electro-mechanical devices. For example, if an electronic circuit containing only n-channel transistors then an NMOS fabrication process is required. For an NMOS fabrication process, the device quality silicon layer 9 must be doped P-type. Note that the present invention does not require any change to the standard non-SOI fabrication process employed.

Figure 5:
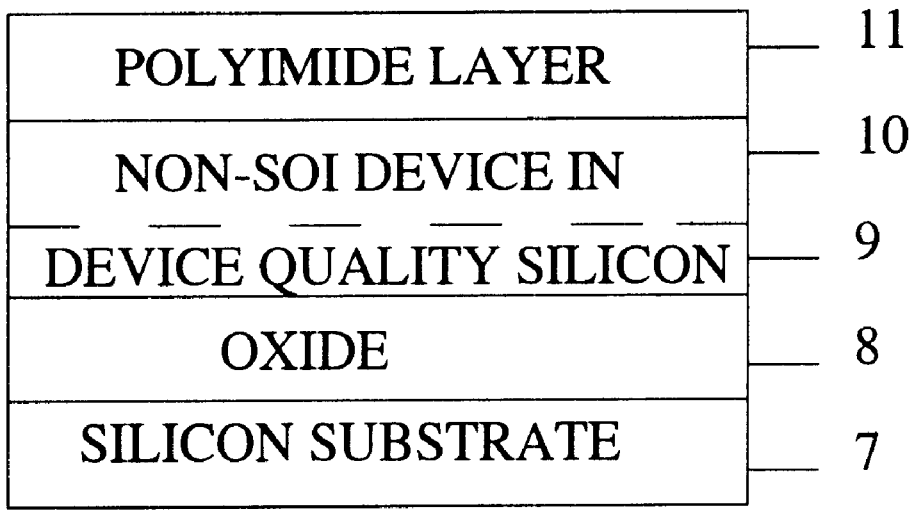
FIG. 5 is a side cross-sectional view of the device of FIG. 4 with a layer of polyimide formed on the non-SOI device.

The third step 4 in the method listed in FIG. 1 is to apply a layer of polyimide, or functionally equivalent, material on the non-SOI device 10 fabricated in the device quality silicon layer 9. FIG. 5 shows a cross-sectional view of the structure of FIG. 4 with the addition of a polyimide layer 11 on the non-SOI device 10. The polyimide layer 11 must be of sufficient strength and thickness to provide mechanical support for the final structure of the present invention so that the structure may be handled without being damaged. In the preferred method, the polyimide layer is 8 um thick. Openings (not shown) in the polyimide layer must be made to allow access to the non-SOI device 10 formed in the device quality silicon layer 9. The openings may be made prior to thinning. In an alternative method, a supporting layer or wafer may be attached to the backside of the thinned device instead of applying a layer of polyimide as described above.

Figure 6:
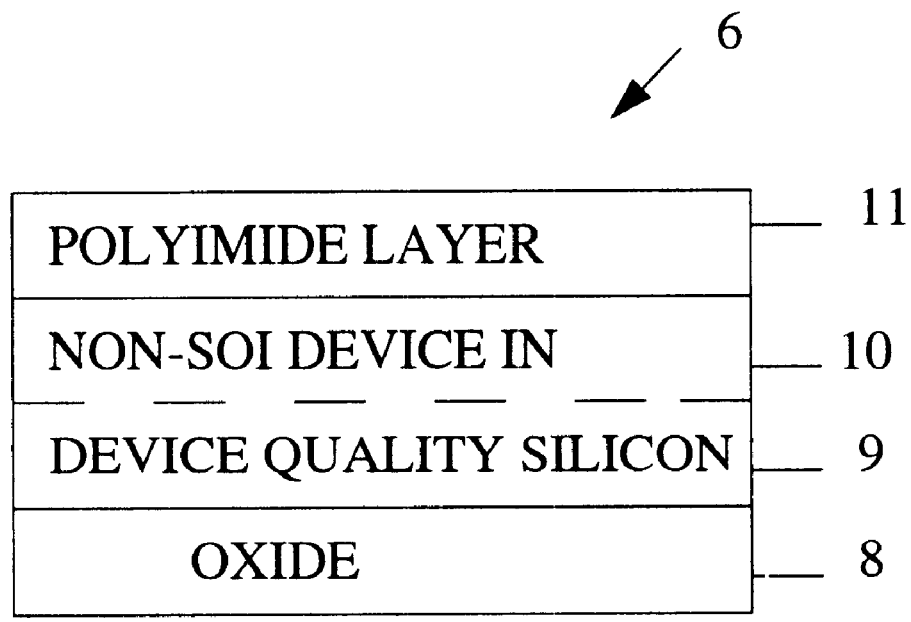
FIG. 6 is a side cross-sectional view of the device of FIG. 4 after thinning.

The fourth step 5 in the method listed in FIG. 1 is to use an SOI thinning process to thin the structure resulting from the third step of the method. FIG. 6 shows a side cross-sectional view of the thinned non-SOI structure 12 resulting from the present invention. Essentially, the silicon substrate 7 of the SOI starting wafer 6 is removed. That is, an SOI thinning process may be used to remove the silicon substrate 7 so that the user is left with a structure having an oxide layer 8, a device quality silicon layer 9 on the oxide layer 8, a non-SOI device 10 formed in the device quality silicon layer 9, and a polyimide layer 11 formed on the non-SOI device 10.

Figure 7:
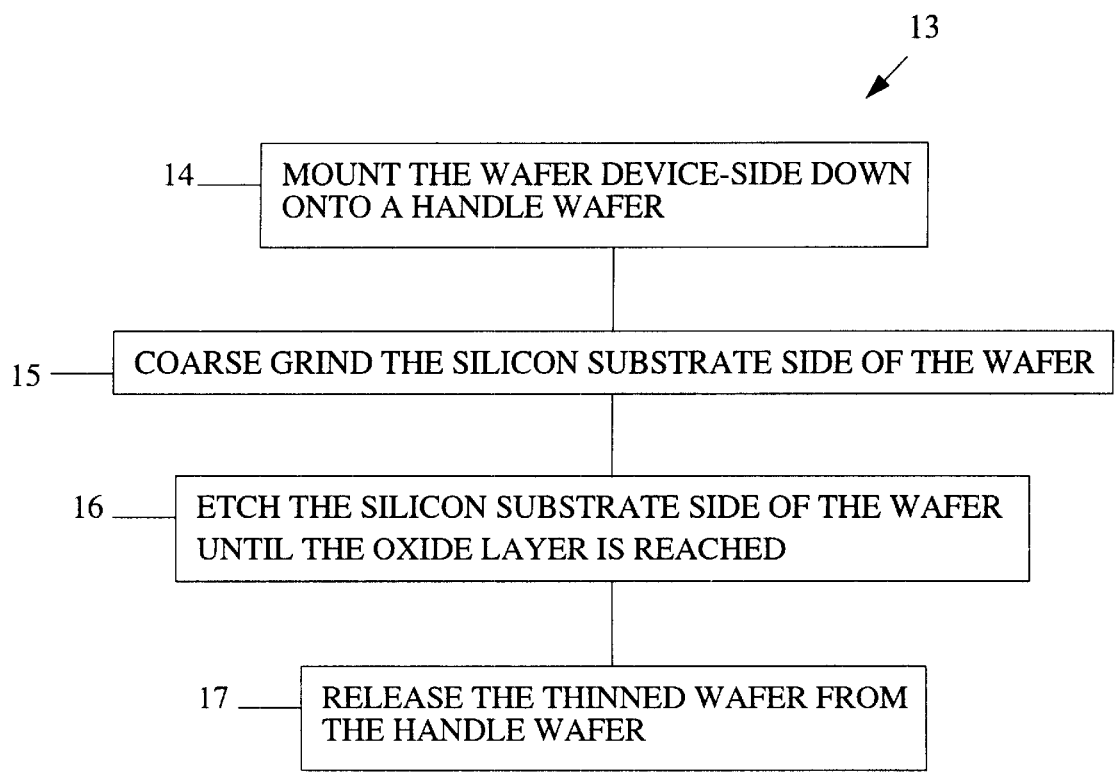
FIG. 7 lists the steps of an SOI thinning process.

The SOI thinning process 13 used in the present method is listed in FIG. 7. The first step 14 in the thinning process 13 is to bond the structure of FIG. 4 non-SOI device-side down onto a handle wafer (not shown). Any suitable bonding material may be used, but wax is preferred. The second step 15 in the thinning process 13 is to mechanically grind the silicon substrate 7 of the SOI starting wafer 6 to within the range of from 150 um to 25 um. The third step 16 in the thinning process 13 is to chemically etch the mechanically ground silicon substrate 7 to the oxide layer 8. Here, the oxide layer 8 acts as an etch stop. It is preferred that a selective wet chemical etch be used to remove the silicon substrate 7, where the etchant is either tetramethyl ammonium hydroxide (i.e, TMAH), ethylene-diamine pyrocatechol (i.e., EDP), or potassium hydroxide (i.e., KOH). The final step 17 in the thinning process 13 is to release the thinned non-SOI structure 12 as shown in FIG. 6 from the handle wafer (not shown). If wax is used as the bonding material then the wax is melted.

The present invention combines the best of non-SOI fabrication processes with the superior thinning characteristics of an SOI thinning process in order to obtain non-SOI devices thinned to a thickness of less than or equal to 50 um. The present invention may be used to obtain thinned non-SOI structures that are thinner than 10 um and have uniformity of thickness of 5% or better across a 150 mm wafer.

What is claimed is:

1. A method of making a semiconductor device using an SOI starting wafer and thinning the same, comprising the steps of:
    a) receiving the SOI starting wafer, where the SOI starting wafer includes a silicon substrate and an oxide layer thereon;
    b) selecting a semiconductor fabrication process for fabricating the semiconductor device from a group of semiconductor fabrication processes consisting of CMOS, NMOS, PMOS, Bipolar, and BICMOS;
    c) forming a layer of device quality silicon on the oxide layer of the SOI starting wafer to a sufficient thickness and doping profile to realize the semiconductor device;
    d) fabricating the semiconductor device in the device quality silicon layer using the semiconductor fabrication process selected;
    e) forming a support layer on the device quality silicon layer having the semiconductor device fabricated therein; and
    f) thinning the result of step (e).

2. The method of claim 1, wherein said step of forming a layer of device quality silicon on the oxide layer of the SOI starting wafer to a sufficient thickness and doping profile to realize the semiconductor device comprises the step of bonding a pre-formed layer of device quality silicon of a sufficient thickness and doping profile to realize the semiconductor device onto the oxide layer of the SOI starting wafer.

3. The method of claim 2, wherein said step of forming a support layer on the device quality silicon layer having a semiconductor device fabricated therein comprises the step of forming a polyimide layer on the device quality silicon layer having a semiconductor device fabricated therein.

4. The method of claim 3, wherein said step of thinning the result of step (e) comprises the steps of:
    a) bonding the result of step (e) semiconductor-device-side-down onto a handle wafer;
    b) grinding mechanically the silicon substrate of the SOI starting wafer;
    c) etching chemically the mechanically ground silicon substrate of the SOI starting wafer to the oxide layer of the SOI starting wafer; and
    d) releasing the chemically etched semiconductor device from the handle wafer.

5. The method of claim 4, wherein said step of bonding the result of step (e) semiconductor-device-side-down onto a handle wafer is comprised of bonding the result of step (e) semiconductor-device-side-down onto a handle wafer using wax.

6. The method of claim 5, wherein said step of grinding mechanically the silicon substrate of the SOI starting wafer is comprised of grinding mechanically the silicon substrate of the SOI starting wafer to a thickness in the range of from 150 um to 25 um.

7. The method of claim 6, wherein said step of etching chemically the mechanically ground silicon substrate of the SOI starting wafer to the oxide layer of the SOI starting wafer is comprised of etching chemically the mechanically ground silicon substrate of the SOI starting wafer to the oxide layer of the SOI starting wafer using an etchant selected from the group consisting of tetramethyl ammonium hydroxide, ethylene-diamine pyrocatechol, and potassium hydroxide.

8. The method of claim 7, wherein said step of releasing the chemically etched semiconductor device from the handle wafer is comprised of releasing the chemically etched semiconductor device from the handle wafer by melting the wax.

9. The method of claim 1, wherein said step of forming a support layer on the device quality silicon layer having the semiconductor device fabricated therein comprises the step of forming a polyimide layer on the device quality silicon layer having the semiconductor device fabricated therein.

10. The method of claim 1, wherein said step of thinning the result of step (e) comprises the steps of:
    a) bonding the result of step (e) semiconductor-device-side-down onto a handle wafer;
    b) grinding mechanically the silicon substrate of the SOI starting wafer;
    c) etching chemically the mechanically ground silicon substrate of the SOI starting wafer to the oxide layer of the SOI starting wafer; and
    d) releasing the chemically etched semiconductor device from the handle wafer.

11. The method of claim 10, wherein said step of bonding the result of step (e) semiconductor-device-side-down onto a handle wafer is comprised of bonding the result of step (e) semiconductor-device-side-down onto a handle wafer using wax.

12. The method of claim 10, wherein said step of grinding mechanically the silicon substrate of the SOI starting wafer is comprised of grinding mechanically the silicon substrate of the SOI starting wafer to a thickness in the range of from 150 um to 25 um.

13. The method of claim 10, wherein said step of etching chemically the mechanically ground silicon substrate of the SOI starting wafer to the oxide layer of the SOI starting wafer is comprised of etching chemically the mechanically ground silicon substrate of the SOI starting wafer to the oxide layer of the SOI starting wafer using an etchant selected from the group consisting of tetramethyl ammonium hydroxide, ethylene-diamine pyrocatechol, and potassium hydroxide.

14. The method of claim 11, wherein said step of releasing the chemically etched semiconductor device from the handle wafer is comprised of releasing the chemically etched semiconductor device from the handle wafer by melting the wax.

15. A method of making a semiconductor device using an SOI starting wafer and thinning the same, comprising the steps of:

a) receiving the SOI starting wafer, where the SOI starting wafer includes a silicon substrate and an oxide layer thereon;

b) selecting a semiconductor fabrication process for fabricating the semiconductor device from a group of semiconductor fabrication processes consisting of CMOS, NMOS, PMOS, Bipolar, and BICMOS;

c) forming a layer of device quality silicon on the oxide layer of the SOI starting wafer to a sufficient thickness and doping profile to realize the semiconductor device;

d) fabricating the semiconductor device in the device quality silicon layer using the semiconductor fabrication process selected;

e) thinning the result of step (d); and f) forming a support layer on the oxide layer of the SOI starting wafer after the thinning step of step (e) has been performed.

* * * * *